(12) United States Patent
Lin

(10) Patent No.: US 8,179,199 B2
(45) Date of Patent: May 15, 2012

(54) TRANSISTOR RESISTOR AND ASSOCIATED METHOD

(75) Inventor: Ying-Yao Lin, Jhubei (TW)

(73) Assignee: Realtek Semiconductor Corp., Hsinchu (TW)

( * ) Notice: Subject to any disclaimer, the term of this patent is extended or adjusted under 35 U.S.C. 154(b) by 1152 days.

(21) Appl. No.: 11/820,194

(22) Filed: Jun. 18, 2007

(65) Prior Publication Data

US 2008/0007387 A1    Jan. 10, 2008

(30) Foreign Application Priority Data

Jul. 5, 2006 (TW) ................. 95124430 A

(51) Int. Cl.
   *H03F 3/04* (2006.01)
(52) U.S. Cl. ....................................... 330/296; 330/127
(58) Field of Classification Search ............ 330/296, 330/297, 149, 127, 253, 151, 291, 293
See application file for complete search history.

(56) References Cited

U.S. PATENT DOCUMENTS

2007/0285162 A1* 12/2007 Vitzilaios et al. .......... 330/149

OTHER PUBLICATIONS

Behzad Razavi, *Design of analog CMOS Integrated Circuits*. Preview Edition. McGraw-Hill, 2000, pp. 363-363, 376-377.
Behad Razavi, *CMOS RF Receiver Design for Wireless LAN Applications*, Radio and Wireless Conference, 1999. RAWCON 99. 1999 IEEE, Aug. 1-4, 1999, pp. 275-280.
David A. Johns, and Ken Martin, *Analog Integrated Circuit Design*. John Wiley & Sons, 1997, pp. 623-624.

* cited by examiner

*Primary Examiner* — Michael Shingleton
(74) *Attorney, Agent, or Firm* — Thomas, Kayden, Horstemeyer & Risley, LLP

(57) ABSTRACT

A transistor resistor and an associated method are provided to improve the resistance linearity of the transistor resistor. The transistor resistor includes a transistor operating in the resistive region, where the drain and source of the transistor receive an input signal and an output signal respectively. The transistor resistor also includes a compensating circuit for generating a compensating signal according to the input signal. The compensating signal is provided to the gate of the transistor such that the voltage difference between the gate and source of the transistor approximates to a constant.

22 Claims, 6 Drawing Sheets

TRANSISTOR RESISTOR AND ASSOCIATED METHOD

BACKGROUND OF THE INVENTION (a). Field of the Invention

This invention relates to a resistor device, and more particularly, to a transistor resistor and an associated method.

(b). Description of the Prior Arts

Resistors are commonly used in integrated circuits (IC). Modern semiconductor processes offer several methods for resistor implementation. For example, the standard complimentary metal oxide semiconductor (CMOS) process provides several types of resistor, such as silicided polysilicon, silicided p+ or n+ active region, n-well and metal layer, where n-well has the highest resistance per unit area at about 1 k ohm/square. However, some circuits require very large resistance. For instance, a 3 dB 100 kHz first-order filter with 10 pF capacitance requires 160k ohm resistance, which means the resistor, even if a n-well resistor is used, will occupy a large space within the IC. This will create tremendous challenge in modern IC design where small-size, high-density IC is required.

Thus some IC designers would operate a MOS transistor in the resistive region (also called triode region) to use it as a resistor and obtain very high resistance per unit area. But a big drawback of such approach is that the resistance will change along with input signals, hence resulting in poor linearity.

SUMMARY OF THE INVENTION

Therefore, an objective of the present invention is to provide a transistor resistor and an associated method where the transistor resistor has good resistance linearity.

Another objective of the present invention is to provide a transistor resistor and an associate method where the transistor resistor offers high resistance.

Yet another objective of the present invention is to provide a transistor resistor and an associated method where the transistor resistor has good resistance linearity and offers high resistance.

In one embodiment of the invention, a transistor resistor comprises: a first transistor operating in a resistive region, wherein a drain of the first transistor receives a first input signal, and a source of the first transistor outputs a first output signal; and a compensation circuit for generating a first compensation signal according to the first input signal, wherein the first compensation signal is provided to a gate of the first transistor such that a voltage difference between the gate and the source of the first transistor approaches a constant.

In one embodiment of the invention, a method for improving linearity of a transistor resistor comprises: providing a first transistor operating in a resistive region, wherein a drain of the first transistor receives an input signal, and a source of the first transistor outputs an output signal; and generating a compensation signal according to the input signal, wherein the compensation signal is provided to a gate of the first transistor such that a voltage difference between the gate and the source of the first transistor approaches a constant.

The features and advantages of the present invention will be more readily understood and apparent from the following detailed description of the invention, which should read in conjunction with the accompanying drawing and from the claims which are appended to the end of the detailed description.

DETAILED DESCRIPTION OF THE INVENTION

Figure 1A:
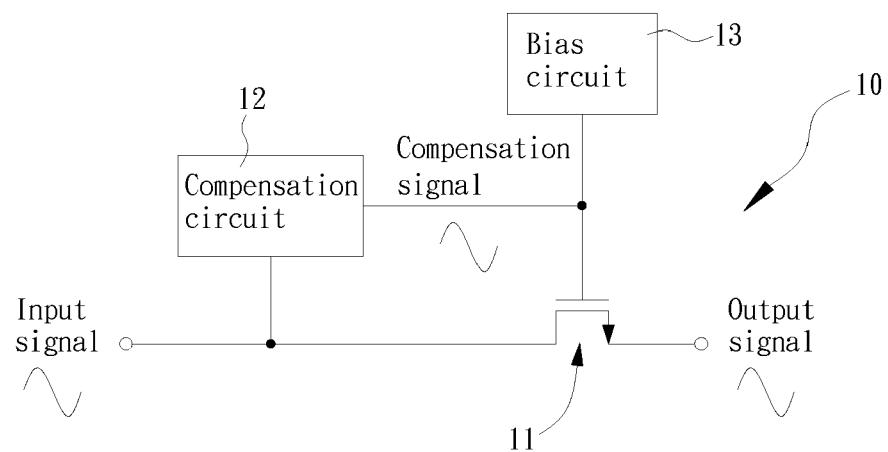
FIG. 1A is a diagram of the transistor resistor according to an embodiment of the invention.

The description below will use a MOS transistor as an example, but the scope of the invention is not limited to the MOS transistor. FIG. 1A is a diagram of a transistor resistor according to an embodiment of the invention. As shown, the transistor resistor 10 comprises a NMOS transistor 11, a compensation circuit 12 and a bias circuit 13. The NMOS transistor 11 operates in the resistive region, that is, its gate-to-source voltage $V_{GS}$ must be greater than a threshold voltage $V_T$, and its drain-to-source voltage $V_{DS}$ must be smaller. When the NMOS transistor 11 operates in resistive region, a current $i_D$ will flow into the drain and flow out of the source, and the relationship between $i_D$ and $V_{DS}$ is:

$$i_D = 2K(V_{GS} - V_T)V_{DS} \qquad \text{Eq. (1)}$$

where $$K = \frac{1}{2}\mu_n C_{ox} \frac{W}{L},$$

$\mu_n$ and $C_{ox}$ are material-specific parameters, and W and L are respectively the width and length of the gate. From Eq. (1), the resistance of the NMOS transistor 11 is derived as:

$$R_{MOS} = V_{DS}/i_D = 1/[2K(V_{GS} - V_T)] \qquad \text{Eq. (2)}$$

As shown in FIG. 1A, the bias circuit 13 provides a bias voltage to the gate of the transistor 11 and thereby the transistor 11 operates in the resistive region. When the drain of the transistor 11 receives an input signal, the output signal from the source would undergo in-phase change with the input signal as shown by the signal waveforms in FIG. 1A (in this embodiment, both input and output signals are voltage signals). However as shown in Eq. (2), the resistance $R_{MOS}$ of the transistor 11 changes with $V_{GS}$. Thus if the gate voltage is maintained at the bias voltage supplied by the bias circuit 13, $V_{GS}$ would drift along with the variation of the output signal, and $R_{MOS}$ would also vary accordingly. In this embodiment, the compensation circuit 12 generates a compensation signal in phase with the input signal (thus also in phase with the output signal) and add the compensation signal to the bias voltage supplied by the bias circuit 13, thereby enabling $V_{GS}$ to approach a constant. As a result, $R_{MOS}$ will approach a constant value, thereby improving the resistance linearity. It is notable that as long as the compensation signal generated by the compensation circuit 12 can enable $V_{GS}$ to approach a constant, the compensation circuit 12 can be implemented in any manner, for example, but not limited to, a common non-inverting amplifier.

Figure 1B:
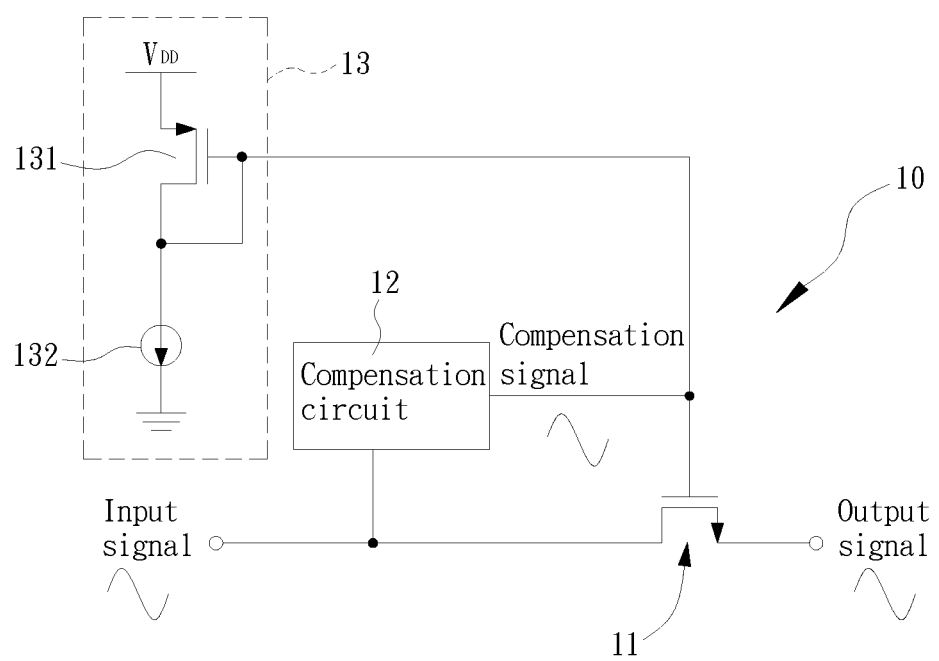
FIG. 1B is a circuit diagram of an embodiment of the bias circuit in FIG. 1A.

FIG. 1B is a circuit diagram of an embodiment of the bias circuit 13. The bias circuit 13 includes a diode-connected PMOS transistor 131 and a current source 132. The source, gate and drain of the transistor 131 are respectively coupled to a voltage source $V_{DD}$, the gate of the transistor 11 and the current source 132. The diode-connected mode is to couple the gate and drain of the transistor 131 such that the transistor 131 can constantly operate in the saturation region (also called constant-current region), and the gate voltage of the transistor 131 will not be locked and may vary with the addition of the compensation signal.

Figure 2:
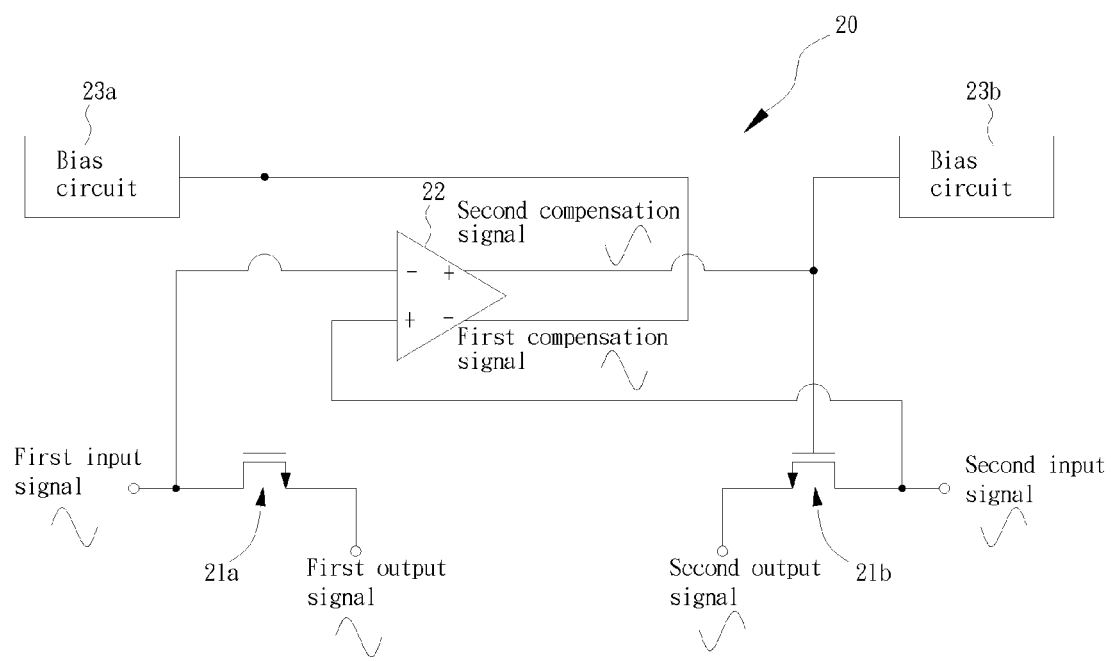
FIG. 2 is a diagram showing a transistor resistor used in a differential configuration according to an embodiment of the invention.

FIG. 2 is a diagram showing a transistor resistor used in a differential configuration according to an embodiment of the invention. As shown, the transistor resistor 20 contains NMOS transistors 21a and 21b, a differential amplifier 22 and bias circuits 23a and 23b. Both the transistors 21a and 21b operate in the resistive region. Their resistances also satisfy Eq. (2). The bias circuits 23a and 23b respectively provide a bias voltage to the transistors 21a and 21b for them to operate in the resistive region. The drains of the transistors 21a and 21b respectively receive a first input signal and a second input signal, where the second input signal is an inverse signal of the first input signal. A first output signal and a second output signal respectively output by the sources of the transistors 21a and 21b would undergo in-phase change with the first input signal and the second input signal respectively, as shown by the signal waveforms in the FIG. 2 (in this embodiment, all input and output signals are voltage signals). In this embodiment, the differential amplifier 22 is used as a compensation circuit to generate, according to the first and the second input signals, a first and a second compensation signals in phase with the first and second output signals respectively. The first and the second compensation signals are respectively added to the gates of the transistors 21a and 21b to enable $V_{GS}$ of the transistors 21a and 21b to approach a constant. As a result, the resistances of the transistors 21a and 21b will approach a constant value, and the resistance linearity of the transistors 21a and 21b will also be improved.

Figure 3:
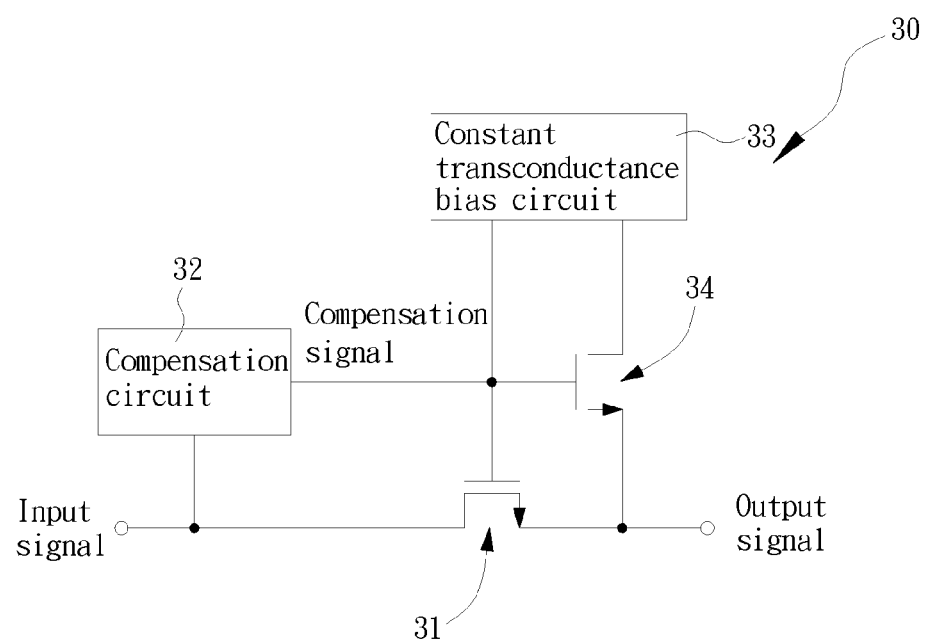
FIG. 3 is a diagram of a transistor resistor according to a preferred embodiment of the invention.

FIG. 3 is a diagram of a transistor resistor according to a preferred embodiment of the invention. As shown, the transistor resistor 30 comprises NMOS transistors 31 and 34, a compensation circuit 32 and a constant transconductance bias (or called constant-$g_m$ bias) circuit 33. The transistors 31 and 34 respectively operate in the resistive region and saturation region. Because the transistor 34 operates in the saturation region, its drain current can be expressed as:

$$I_D = K(V_{GS} - V_T)^2$$

Thus the transconductance value of the transistor 34 is $$g_m = \frac{\partial I_D}{\partial V_{GS}} = 2K(V_{GS} - V_T) \quad \text{Eq. (3)}$$

Because the gates of the transistors 31 and 34 are connected to each other and their sources are also connected to each other, their $V_{GS}$ are equal. In addition, in this preferred embodiment, the gates of the NMOS transistors 31 and 34 are designed to have the substantially same width-to-length ratio and disposed on the same IC. Thus the two transistors have the same K and $V_T$. Under these conditions, it is derived from Eqs. (2) and (3) that the resistance of the transistor 31 is a reciprocal of the transconductance of the transistor 34.

The constant transconductance bias circuit 33 provides a bias current to the transistor 34 to keep its transconductance from the influence of temperature, component manufacturing process and voltage source needed for the operation of the constant transconductance bias circuit 33. Because the resistance of the transistor 31 is the reciprocal of the transconductance of the transistor 34, the resistance of the transistor 31 is not also influenced by the aforementioned factors, thereby enhancing its reliability. The constant transconductance bias technique is commonly known to those skilled in the art, and hence will not be elaborated here.

Figure 4:
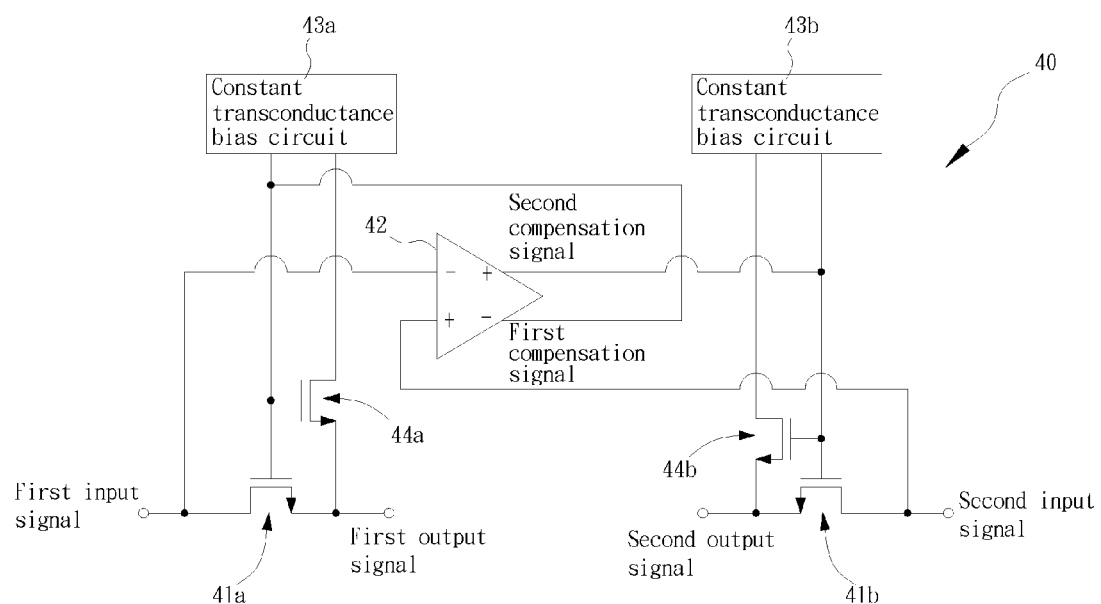
FIG. 4 shows a transistor resistor according to another preferred embodiment of the invention.

FIG. 4 shows a transistor resistor according to another preferred embodiment of the invention, which applies the embodiment in FIG. 3 to a differential configuration. As shown in FIG. 4, the transistor resistor 40 contains NMOS transistors 41a, 41b, 44a and 44b, a differential amplifier 42 and constant transconductance bias circuits 43a and 43b. The transistors 41a and 41b operate in the resistive region, while the transistors 44a and 44b operate in the saturation region. Based on the deduction above, the resistances of the transistors 41a and 41b are respectively the reciprocals of the transconductance of the transistors 44a and 44b. In this preferred embodiment, the differential amplifier 42 is used as a compensation circuit to generate, according to the first and the second input signals (both are inverse to each other), a first compensation signal and a second compensation signal in phase with the first and second output signals respectively. The first and second compensation signals are respectively added to the gates of the transistors 41a and 41b to enable $V_{GS}$ of the transistors 41a and 41b to approach a constant. As a result, the resistances of the transistors 41a and 41b will approach a constant value. Moreover, the constant transconductance bias circuit 43a and 43b respectively keep the transconductance of the transistors 44a and 44b from the influence of temperature, component manufacturing process and voltage source of the bias circuit. Thus, the resistances of the transistors 41a and 41b are not also influenced by the aforementioned factors, thereby enhancing their reliability.

In FIGS. 1A, 2, 3 and 4, PMOS transistors instead of NMOS transistors can be used to implement the MOS transistor resistor of the invention, which will not be elaborated as it is commonly known to those skilled in the art.

Figure 5:
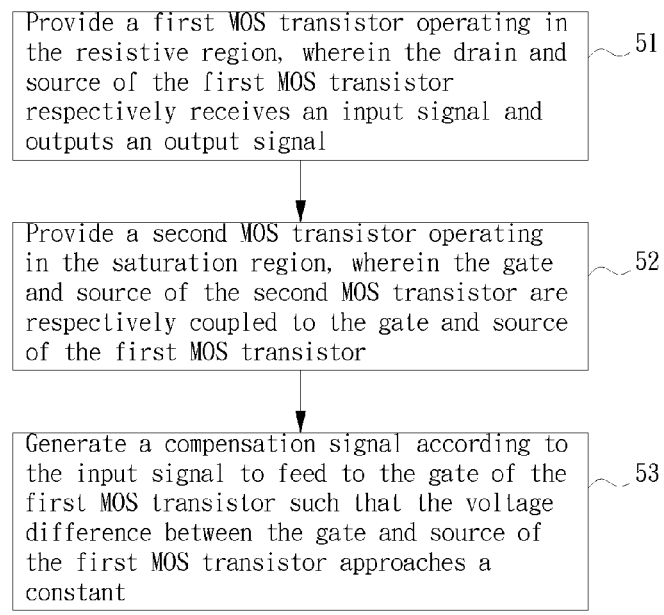
FIG. 5 shows a flow chart of the method for improving the linearity of a transistor resistor according to a preferred embodiment of the invention.

FIG. 5 shows a flow chart of the method for improving the linearity of a transistor resistor according to a preferred embodiment of the invention, which comprises the following steps:

Step 51: Provide a first MOS transistor operating in the resistive region, wherein the drain and source of the first MOS transistor respectively receives an input signal and outputs an output signal;

Step 52: Provide a second MOS transistor operating in the saturation region, wherein the gate and source of the second MOS transistor are respectively coupled to the gate and source of the first MOS transistor; and Step 53: Generate a compensation signal according to the input signal to feed to the gate of the first MOS transistor such that the voltage difference between the gate and source of the first MOS transistor approaches a constant.

While the present invention has been shown and described with reference to the preferred embodiments thereof and in terms of the illustrative drawings, it should not be considered as limited thereby. Various possible modifications and alterations could be conceived of by one skilled in the art to the form and the content of any particular embodiment, without departing from the scope and the spirit of the present invention.

What is claimed is:

1. A transistor resistor comprising:
   a first transistor operating in a resistive region, wherein a drain of the first transistor receives a first input signal, and a source of the first transistor outputs a first output signal;
   a compensation circuit for generating a first compensation signal according to the first input signal, wherein the first compensation signal is provided to a gate of the first transistor such that a linearity of the transistor resistor is improved; and a bias circuit, coupled to the gate of the first transistor, for generating a bias to bias the first transistor.

2. The transistor resistor of claim 1, wherein a variation of the first compensation signal corresponds to a variation of the first output signal.

3. The transistor resistor of claim 2, wherein the first compensation signal and the first output signal are in-phase voltage signals.

4. The transistor resistor of claim 1, wherein the first compensation signal and the first input signal are in-phase voltage signals.

5. The transistor resistor of claim 1, wherein the bias circuit comprises a diode-connected transistor.

6. The transistor resistor of claim 1, further comprising:
a second transistor operating in a resistive region, a drain of the second transistor receives a second input signal, and a source of the second transistor outputs a second output signal, wherein the second input signal is an inverse signal of the first input signal.

7. The transistor resistor of claim 6, wherein the compensation circuit generates a second compensation signal according to the second input signal.

8. The transistor resistor of claim 1, wherein the compensation circuit is a differential amplifier.

9. The transistor resistor of claim 1, further comprising:
a second transistor operating in a saturation region, a gate and a source of the second transistor are respectively coupled to the gate and the source of the first transistor.

10. The transistor resistor of claim 9, wherein the first transistor and the second transistor are disposed on an integrated circuit (IC).

11. The transistor resistor of claim 9, wherein the gates of the first transistor and the second transistor have a substantially same width-to-length ratio.

12. The transistor resistor of claim 9, further comprising:
a constant transconductance bias circuit for providing a constant transconductance bias for the second transistor.

13. A method for improving linearity of a transistor resistor comprising:
providing a first transistor operating in a resistive region, wherein a drain of the first transistor receives an input signal, and a source of the first transistor outputs an output signal;

generating a compensation signal according to the input signal, wherein the compensation signal is provided to a gate of the first transistor such that the linearity of the transistor resistor is improved; and providing a second transistor operating in a saturation region, wherein a gate and a source of the second transistor are respectively coupled to the gate and the source of the first transistor.

14. The method of claim 13, wherein a variation of the compensation signal corresponds to a variation of the output signal.

15. The method of claim 13, wherein the compensation signal and the input signal are in-phase voltage signals.

16. The method of claim 13, wherein the first transistor and the second transistor are disposed on an integrated circuit (IC).

17. The method of claim 13, wherein the gates of the first transistor and the second transistor have a substantially same width-to-length ratio.

18. The method of claim 13, further comprising:
providing a constant transconductance bias for the second transistor.

19. A transistor resistor comprising:
a first transistor operating in a resistive region, wherein a drain of the first transistor receives a first input signal, and a source of the first transistor outputs a first output signal;

a compensation circuit for generating a first compensation signal according to the first input signal, wherein the first compensation signal is provided to a gate of the first transistor such that a linearity of the transistor resistor is improved; and a second transistor operating in a saturation region, a gate and a source of the second transistor are respectively coupled to the gate and the source of the first transistor.

20. The transistor resistor of claim 19, wherein the first transistor and the second transistor are disposed on an integrated circuit (IC).

21. The transistor resistor of claim 19, wherein the gates of the first transistor and the second transistor have a substantially same width-to-length ratio.

22. The transistor resistor of claim 19, further comprising:
a constant transconductance bias circuit for providing a constant transconductance bias for the second transistor.

* * * * *